United States Patent
Chiang et al.

[19]

[11] Patent Number: 6,159,786
[45] Date of Patent: Dec. 12, 2000

[54] WELL-CONTROLLED CMP PROCESS FOR DRAM TECHNOLOGY

[75] Inventors: Min-Hsiung Chiang, Taipei; James Cheng-Ming Wu, Kao-Hsiung; Jenn-Ming Huang, Hsin-Chu, all of Taiwan

[73] Assignee: Taiwan Semiconductor Manufacturing Company, Hsin-Chu, Taiwan

[21] Appl. No.: 09/210,702

[22] Filed: Dec. 14, 1998

[51] Int. Cl.$^7$ ................ H01L 21/8234; H01L 21/8244
[52] U.S. Cl. ............................................. 438/238
[58] Field of Search ............................. 438/238, 186, 438/142

[56] References Cited

U.S. PATENT DOCUMENTS

| | | | |
|---|---|---|---|
| 5,246,884 | 9/1993 | Jaso et al. | 437/225 |
| 5,262,346 | 11/1993 | Bindal et al. | 437/62 |
| 5,324,690 | 6/1994 | Gelatos et al. | 437/236 |
| 5,335,138 | 8/1994 | Sandhu et al. | 361/303 |
| 5,362,669 | 11/1994 | Boyd et al. | 437/67 |
| 5,385,866 | 1/1995 | Bartush | 437/186 |
| 5,440,157 | 8/1995 | Imai et al. | 257/310 |
| 5,663,108 | 9/1997 | Lin | 438/624 |
| 5,714,779 | 2/1998 | Auer et al. | 257/306 |
| 5,717,236 | 2/1998 | Shinkawata | 257/306 |
| 5,843,830 | 12/1998 | Graettinger et al. | 438/396 |

*Primary Examiner*—Vu A. Le
*Assistant Examiner*—Christian D. Wilson
*Attorney, Agent, or Firm*—George O. Saile; Stephen B. Ackerman; Rosemary L. S. Pike

[57] ABSTRACT

A new method of maintaining good control of the dielectric thickness over a top capacitor plate during planarization by CMP by introducing a CMP stop layer under the topmost dielectric layer is described. Semiconductor device structures, including a node contact region, are provided in and on a semiconductor substrate. A bottom plate electrode is formed contacting the node contact region through an opening in a first insulating layer. A capacitor dielectric layer is deposited overlying the bottom plate electrode. A second conducting layer is deposited overlying the capacitor dielectric to form a top plate electrode of the capacitor. A second insulating layer is deposited overlying the second conducting layer. A silicon nitride polish stop layer is deposited overlying the second insulating layer. The polish stop layer, second insulating layer, second conducting layer, and capacitor dielectric layer are patterned to form the DRAM integrated circuit device. A third insulating layer is deposited overlying the first insulating layer and the polish stop layer of the DRAM integrated circuit device. The third insulating layer is planarized by chemical mechanical polishing stopping at the polish stop layer. The polish stop layer protects the top capacitor plate from damage.

19 Claims, 4 Drawing Sheets

WELL-CONTROLLED CMP PROCESS FOR DRAM TECHNOLOGY

BACKGROUND OF THE INVENTION

1. Field of the Invention

The invention relates to the fabrication of integrated circuit devices, and more particularly, to a method of controlling the CMP process so that the oxide thickness over the top capacitor plate is well controlled in the fabrication of integrated circuits.

2. Description of the Prior Art

A dynamic random access memory (DRAM) device includes a number of memory cells in or on a semiconductor substrate. Each memory cell includes a capacitor for storing information and a transistor for selecting a particular capacitor. In the conventional DRAM process, the oxide film overlying the top plate electrode of a capacitor is planarized using chemical mechanical polishing (CMP). This process must have very tight thickness control in order to adequately protect the underlying capacitor. CMP has difficulty controlling thickness uniformity; the underlying capacitor plate may be damaged. This may cause a short during subsequent metal deposition and etching. The oxide film may be made thicker to prevent this occurrence. However, if the interlevel dielectric layer, of which the oxide is part, is too thick, this will lead to difficulties in contact etching. It is desired to achieve good oxide thickness control over the top plate electrode of a capacitor while not increasing the contact etch oxide thickness in a CMP process.

U.S. Pat. No. 5,714,779 to Auer et al shows two dielectric layers overlying a top plate electrode of a capacitor. The topmost layer is planarized by CMP. No mention is made of a CMP stop layer. U.S. Pat. No. 5,663,108 to Lin teaches planarizing a layer of oxide overlying a spinon-glass layer using CMP. U.S. Pat. Nos. 5,385,866 to Bartush and 5,324,690 to Gelatos et al disclose a boron nitride polish stop layer for CMP. U.S. Pat. Nos. 5,362,669 to Boyd et al and 5,262,348 to Bindal et al disclose silicon nitride stop layers in trench filling. U.S. Pat. No. 5,246,884 to Jaso et al teaches a diamond or diamond-like carbon stop layer for polishing the dielectric over metal lines. None of these references using polish stop layers address the planarization of a dielectric layer over capacitors.

SUMMARY OF THE INVENTION

Accordingly, it is a principal object of the present invention to provide an effective and very manufacturable method of planarizing an interlevel dielectric layer using CMP wherein there is tight thickness control of the remaining dielectric layer.

Another object of the present invention is to provide a method of planarizing an interlevel dielectric layer overlying the top plate electrode of a capacitor using CMP where the remaining dielectric layer is thick enough to protect the capacitor plate and thin enough for the subsequent contact etch.

Yet another object is to maintain good control of the dielectric thickness over a top capacitor plate during planarization by CMP.

A further object of the invention is to maintain good control of the dielectric thickness over a top capacitor plate during planarization by CMP by introducing a CMP stop layer under the topmost dielectric layer.

A still further object of the invention is to maintain good control of the dielectric thickness over a top capacitor plate during planarization by CMP by introducing a silicon nitride CMP stop layer under the topmost oxide layer.

In accordance with the objects of this invention a new method of maintaining good control of the dielectric thickness over a top capacitor plate during planarization by CMP by introducing a CMP stop layer under the topmost dielectric layer is achieved. Semiconductor device structures, including a node contact region, are provided in and on a semiconductor substrate. A first insulating layer is deposited overlying the semiconductor device structures. A contact opening is etched through the first insulating layer to the node contact region. A first conducting layer is deposited into the contact opening to form the bottom plate electrode of the capacitor. A capacitor dielectric layer is deposited overlying the bottom plate electrode. A second conducting layer is deposited overlying the capacitor dielectric to form a top plate electrode of the capacitor. A second insulating layer is deposited overlying the second conducting layer. A silicon nitride polish stop layer is deposited overlying the second insulating layer. The polish stop layer, second insulating layer, second conducting layer, and capacitor dielectric layer are patterned to form the DRAM integrated circuit device. A third insulating layer is deposited overlying the first insulating layer and the polish stop layer of the DRAM integrated circuit device. The third insulating layer is planarized by chemical mechanical polishing stopping at the polish stop layer. The polish stop layer protects the top capacitor plate from damage.

BRIEF DESCRIPTION OF THE DRAWINGS

In the accompanying drawings forming a material part of this description, there is shown.

DESCRIPTION OF THE PREFERRED EMBODIMENTS

Figure 1:
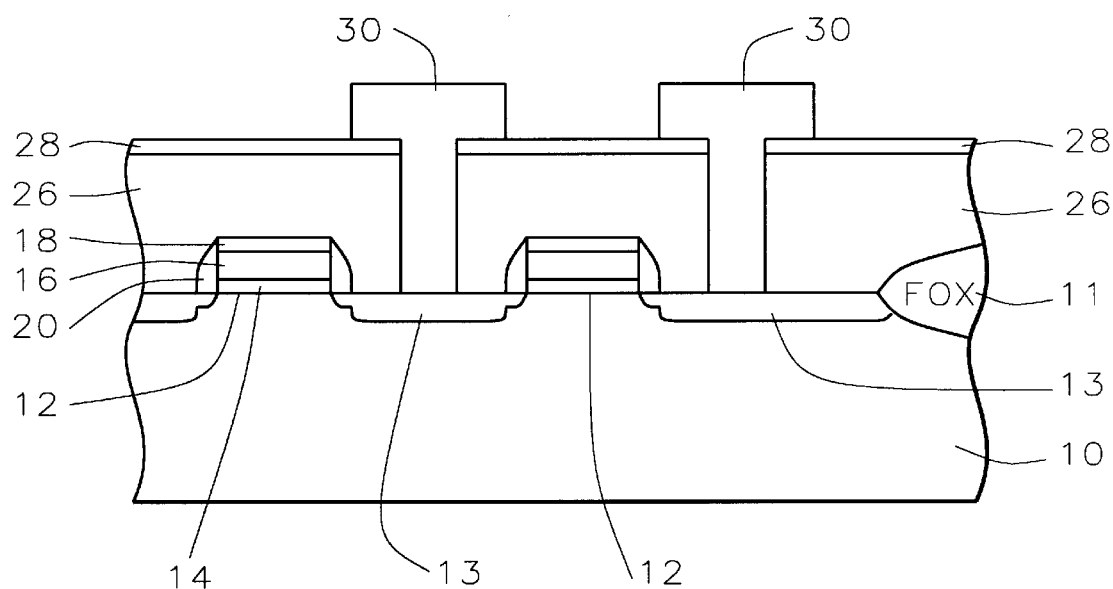
FIGS. 1 through 7 schematically illustrate in cross-sectional representation a preferred embodiment of the present invention.

Referring now more particularly to FIG. 1, there is shown a portion of a partially completed integrated circuit having a monocrystalline semiconductor substrate 10. Gate electrodes 12 are formed as is conventional in the art and as illustrated in FIG. 1. Typically, gate electrodes 12 comprise a polysilicon layer 16 overlying gate oxide layer 14. A polycide layer 18 may complete the gate electrodes 12. Spacers 20 are formed by depositing silicon nitride or tetraethoxysilane (TEOS) oxide or the like over the surface of the substrate and anisotropically etching the layer 20 to form spacers on the sidewalls of the gate electrodes. Source and drain regions 13 are formed as is conventional in the art.

A dielectric layer 26, composed of undoped silicate glass and borophospho-tetraethoxysilane (BP-TEOS), for example, is deposited overlying the gate electrodes 12 and spacers 20 to a thickness of between about 10,000 to 25,000 Angstroms. A layer of silicon nitride 28 is deposited over the layer 26 to a thickness of between about 50 and 300 Angstroms. This layer 28 acts as an etch stop layer during the capacitor top plate etching step.

Contact openings are etched through the dielectric layers 28 and 26 to contact the underlying source and drain regions 13. A layer of polysilicon is deposited over the silicon nitride layer and within the contact openings and patterned as shown in FIG. 1 to form bottom capacitor plate electrodes 30.

Figure 2:
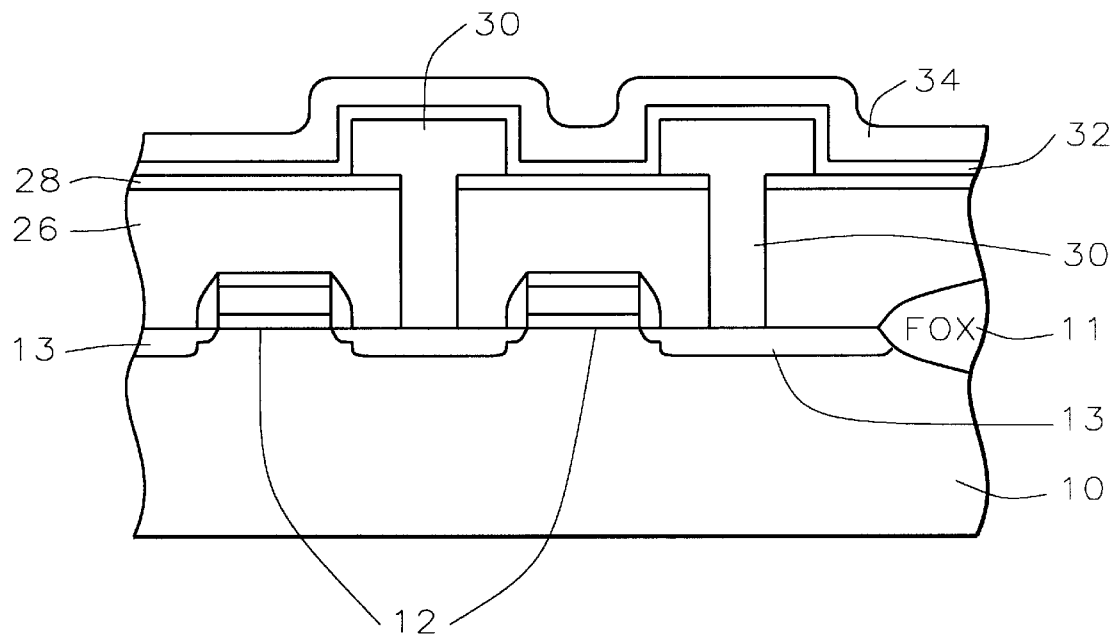

Referring now to FIG. 2, a capacitor dielectric layer 32 is deposited over the top surfaces of the substrate. This may be a layer of silicon oxide, silicon nitride, silicon oxide (ONO) having a thickness of between about 45 and 60 Angstroms. A second polysilicon layer 34 is deposited over the ONO layer 32 to a thickness of between about 500 and 1500 Angstroms. The second polysilicon layer 34 forms the top electrode of the capacitors.

Figure 3:
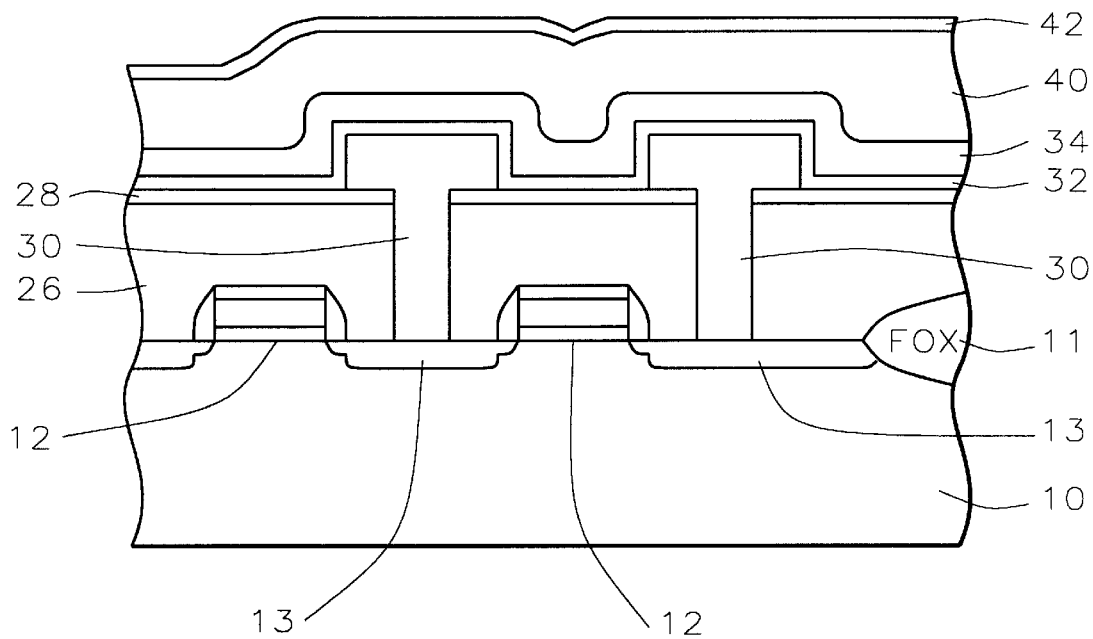

Referring now to FIG. 3, the interlevel dielectric layer of the present invention will be described. A layer of undoped oxide, such as undoped silicate glass (USG) 40 is deposited over the top capacitor plate to a thickness of between about 2500 and 4500 Angstroms. Next, a CMP stopping layer of silicon nitride 42 is deposited by plasma enhanced chemical vapor deposition (PECVD) to a thickness of between about 200 and 1500 Angstroms.

Figure 4:
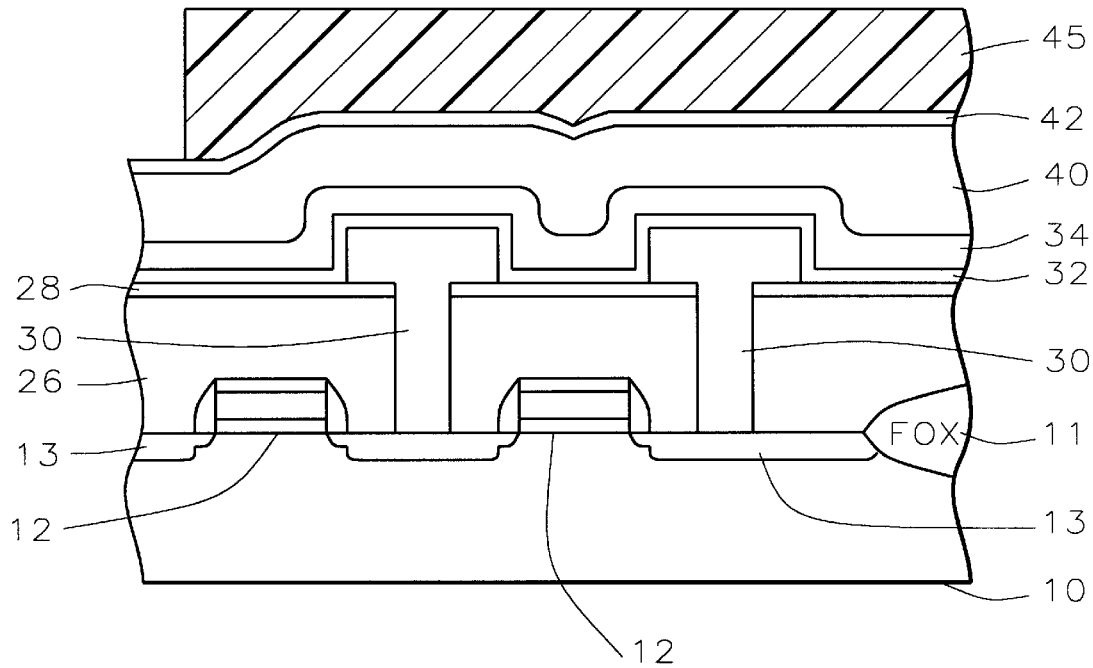
Figure 5:
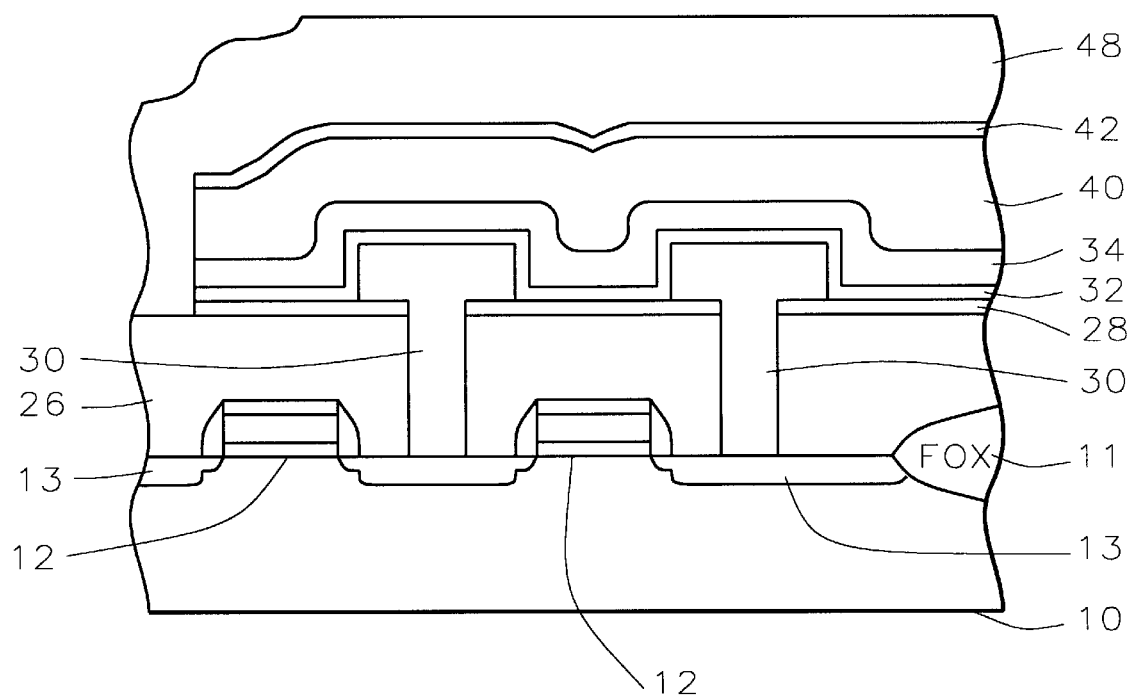

Next, as shown in FIG. 4, a photoresist mask 45 is formed over the silicon nitride layer 42. The dielectric layers 28 and 26, polysilicon layer 34, and ONO layer 32 are etched away in the peripheral area where they are not covered by the mask 45 with an etch stop at silicon nitride layer 28. This forms the capacitor cell plate, illustrated in FIG. 5.

Now, a top dielectric layer 48 is deposited over the capacitor cell plate. This layer may comprise borophosphotetraethoxysilane (BP-TEOS) oxide having a thickness of between about 8000 and 15,000 Angstroms.

Figure 6:
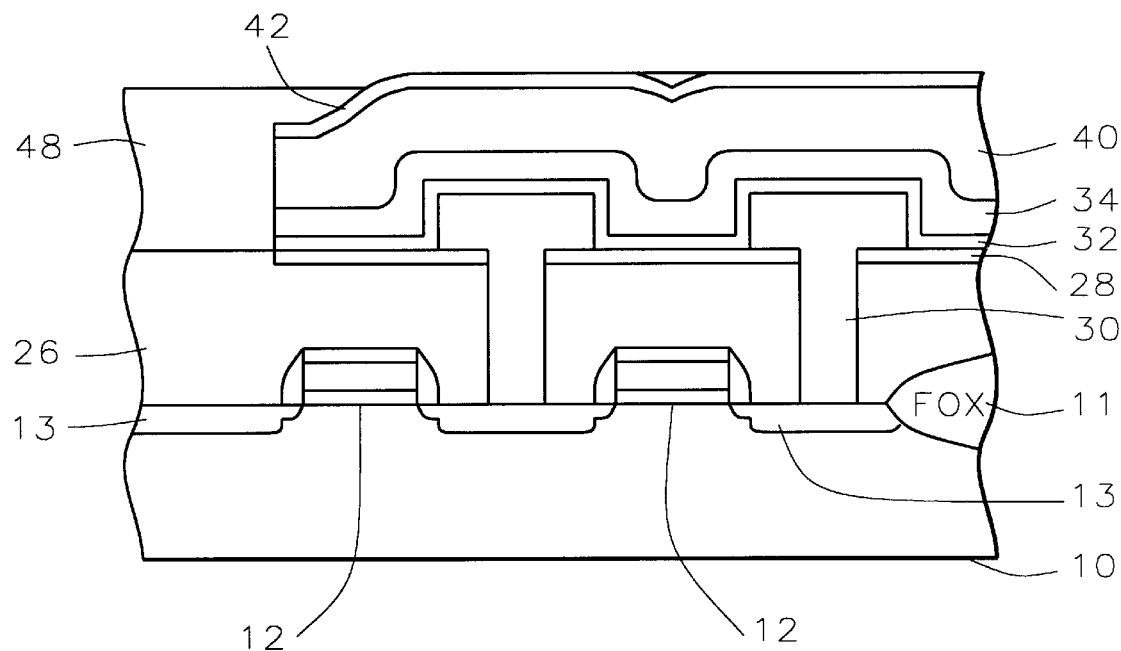

Referring now to FIG. 6, the BP-TEOS layer 48 is planarized by chemical mechanical polishing (CMP) with a CMP stop at the silicon nitride layer 42. In the process of the invention, the CMP ratios are: USG: silicon nitride of 2:1, BP-TEOS: USG of 3:1, and BP-TEOS: silicon nitride of 6:1. Good planarity results because the ratio of BP-TEOS to silicon nitride is so high.

Figure 7:
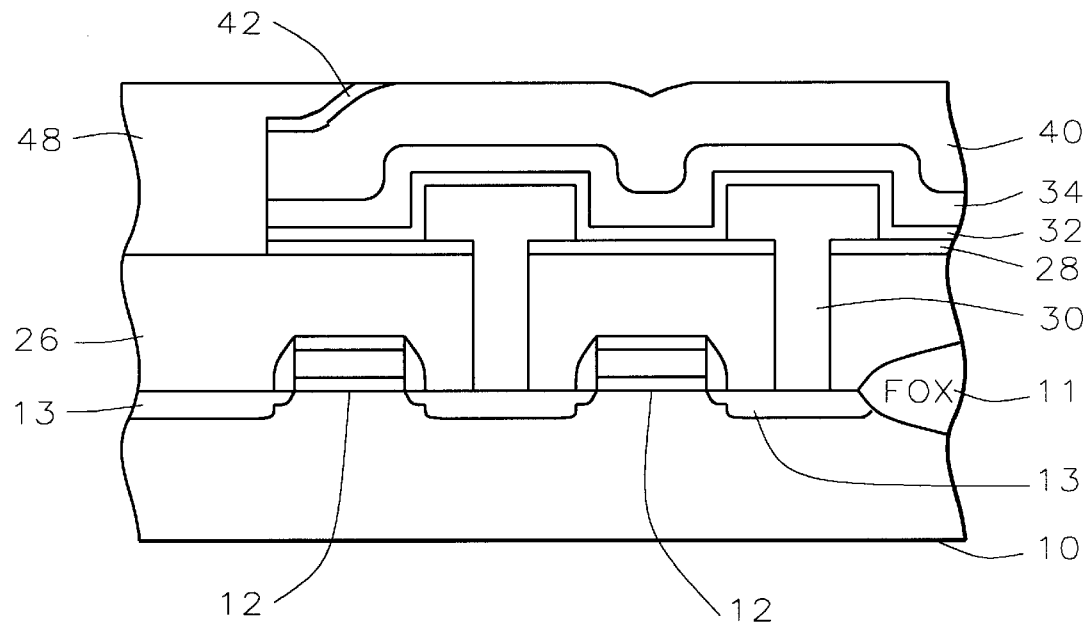

The silicon nitride film 42 is removed by a wet or dry stripping process, resulting in the planarized interlevel dielectric layer, as shown in FIG. 7. The final thickness of the dielectric layer 40 over the top polysilicon plate electrode 34 is fixed to be the thickness of the layer as deposited. The deposited thickness can be well controlled. The silicon nitride layer has acted to preserve the thickness of the dielectric layer 40 while allowing for the planarization of the dielectric layer 48 in the peripheral area. There is no risk of damaging the top plate during CMP because of the presence of the CMP stop layer 42. There is no need to increase the thickness of the layer 40 to protect the capacitor plate.

Figure 8:
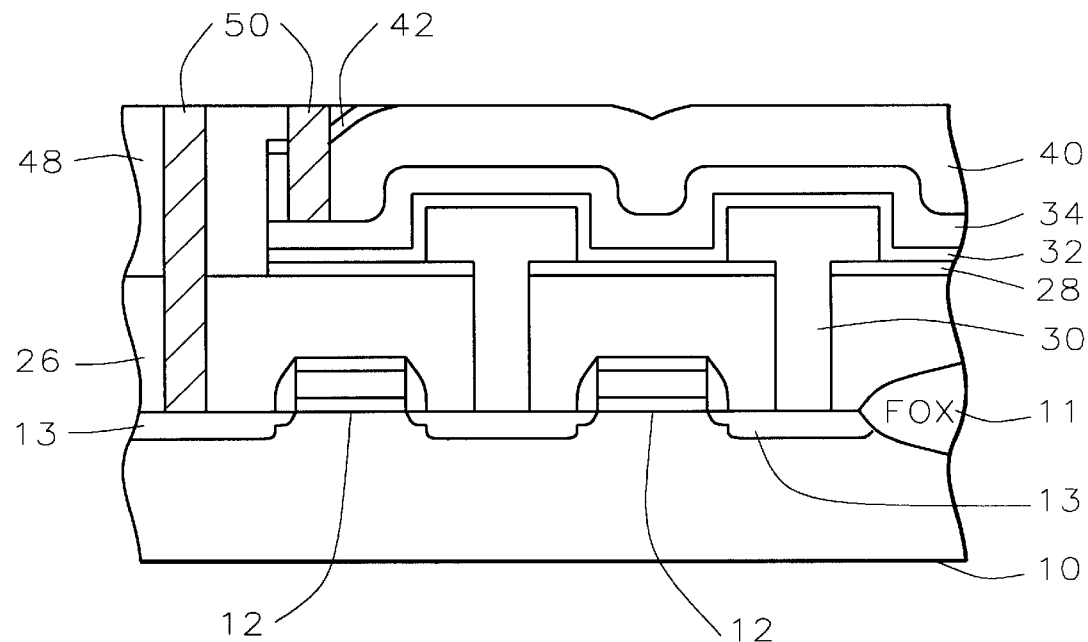
FIG. 8 schematically illustrates in cross-sectional representation a completed DRAM integrated circuit device fabricated by the process of the present invention.

FIG. 8 illustrates a cross-sectional view of the completed integrated circuit DRAM device with electrical connections. For example, openings would be etched through the dielectric layers and filled with metal 50 to complete electrical connections to the top plate of the capacitor and to the active region, as shown.

The process of the present invention provides a planarized interlevel dielectric layer while at the same time controlling the thickness of the dielectric layer over the capacitor plates. The silicon nitride CMP stopping layer prevents CMP damage to the capacitor plates. There is no need to increase the thickness of the dielectric layer over the capacitor plates to protect them adequately.

While the invention has been particularly shown and described with reference to the preferred embodiments thereof, it will be understood by those skilled in the art that various changes in form and details may be made without departing from the spirit and scope of the invention.

What is claimed is:

1. A method of planarizing a DRAM integrated circuit device including a capacitor comprising:

providing semiconductor device structures in and on a semiconductor substrate wherein said semiconductor device structures include a node contact region;

depositing a first insulating layer overlying said semiconductor device structures;

etching a contact opening through said first insulating layer to said node contact region;

depositing a first conducting layer into said contact opening to form the bottom plate electrode of said capacitor;

depositing a capacitor dielectric layer overlying said bottom plate;

depositing a second conducting layer overlying said capacitor dielectric wherein said second conducting layer will form a top plate electrode of said capacitor;

depositing a second insulating layer overlying said top plate electrode;

depositing a polish stop layer overlying said second insulating layer;

etching away said polish stop layer, said second insulating layer, said second conducting layer, and said capacitor dielectric layer where they are not covered by a mask to form said DRAM integrated circuit device;

depositing a third insulating layer overlying said first insulating layer and said polish stop layer of said DRAM integrated circuit device;

polishing said third insulating layer stopping at said polish stop layer; and removing said polish stop layer to complete said planarization of said DRAM integrated circuit device including said capacitor.

2. The method according to claim 1 wherein said first and second conducting layers comprise polysilicon.

3. The method according to claim 1 wherein said second insulating layer comprises undoped silicate glass having a thickness of between about 2500 and 4500 Angstroms.

4. The method according to claim 1 wherein said polish stop layer comprises silicon nitride having a thickness of between about 200 and 1500 Angstroms.

5. The method according to claim 1 wherein said third insulating layer comprises BPTEOS oxide having a thickness of between about 8000 and 25,000 Angstroms.

6. The method according to claim 1 wherein said step of polishing said third insulating layer comprises chemical mechanical polishing (CMP) having a CMP ratio of said second insulating layer to said polish stop layer of 2:1, a CMP ratio of said third insulating layer to said second insulating layer of 3:1, and a CMP ratio of said third insulating layer to said polish stop layer of 6:1.

7. A method of planarizing a DRAM integrated circuit device including a capacitor comprising:

providing semiconductor device structures in and on a semiconductor substrate wherein said semiconductor device structures include a node contact region;

depositing a first insulating layer overlying said semiconductor device structures;

depositing a first silicon nitride layer overlying said first insulating layer;

etching a contact opening through said first silicon nitride layer and said first insulating layer to said node contact region;

depositing a first conducting layer into said contact opening to form the bottom plate electrode of said capacitor;

depositing a capacitor dielectric layer overlying said bottom plate;

depositing a second conducting layer overlying said capacitor dielectric wherein said second conducting layer will form a top plate electrode of said capacitor;

depositing a second insulating layer overlying said top plate electrode;

depositing a second silicon nitride layer overlying said second insulating layer;

etching away said second silicon nitride layer, said second insulating layer, said second conducting layer, and said capacitor dielectric layer where they are not covered by a mask to form said DRAM integrated circuit device;

depositing a third insulating layer overlying said first insulating layer and said second silicon nitride layer of said DRAM integrated circuit device;

polishing said third insulating layer with a polish stop at said second silicon nitride layer; and removing said second silicon nitride layer to complete said planarization of said DRAM integrated circuit device including said capacitor.

8. The method according to claim 7 wherein said first silicon nitride layer has a thickness of between about 50 and 300 Angstroms.

9. The method according to claim 7 wherein said first and second conducting layers comprise polysilicon.

10. The method according to claim 7 wherein said second insulating layer comprises undoped silicate glass having a thickness of between about 2500 and 4500 Angstroms.

11. The method according to claim 7 wherein said second silicon nitride layer has a thickness of between about 200 and 1500 Angstroms.

12. The method according to claim 7 wherein said third insulating layer comprises BPTEOS oxide having a thickness of between about 8000 and 15,000 Angstroms.

13. The method according to claim 7 wherein said step of polishing said third insulating layer comprises chemical mechanical polishing (CMP) having a CMP ratio of said second insulating layer to said polish stop layer of 2:1, a CMP ratio of said third insulating layer to said second insulating layer of 3:1, and a CMP ratio of said third insulating layer to said polish stop layer of 6:1.

14. A method of planarizing a DRAM integrated circuit device including a capacitor comprising:

providing semiconductor device structures in and on a semiconductor substrate wherein said semiconductor device structures include a node contact region;

depositing a first insulating layer overlying said semiconductor device structures;

depositing a first silicon nitride layer overlying said first insulating layer;

etching a contact opening through said first silicon nitride layer and said first insulating layer to said node contact region;

depositing a first conducting layer into said contact opening to form the bottom plate electrode of said capacitor;

depositing a capacitor dielectric layer overlying said bottom plate;

depositing a second conducting layer overlying said capacitor dielectric wherein said second conducting layer will form a top plate electrode of said capacitor;

depositing a second insulating layer overlying said top plate electrode;

depositing a second silicon nitride layer overlying said second insulating layer;

etching away said second silicon nitride layer, said second insulating layer, said second conducting layer, and said capacitor dielectric layer where they are not covered by a mask to form said DRAM integrated circuit device;

depositing a third insulating layer overlying said first insulating layer and said second silicon nitride layer of said DRAM integrated circuit device;

planarizing said third insulating layer using chemical mechanical polishing with a polish stop at said second silicon nitride layer having a CMP ratio of said second insulating layer to said second silicon nitride laver of 2:1, a CMP ratio of said third insulating layer to said second insulating layer of 3:1, and a CMP ratio of said third insulating layer to said second silicon nitride layer of 6:1; and removing said second silicon nitride layer to complete said planarization of said DRAM integrated circuit device including said capacitor.

15. The method according to claim 14 wherein said first silicon nitride layer has a thickness of between about 50 and 300 Angstroms.

16. The method according to claim 14 wherein said first and second conducting layers comprise polysilicon.

17. The method according to claim 14 wherein said second insulating layer comprises undoped silicate glass having a thickness of between about 2500 and 4500 Angstroms.

18. The method according to claim 14 wherein said second silicon nitride layer has a thickness of between about 200 and 1500 Angstroms.

19. The method according to claim 14 wherein said third insulating layer comprises BPTEOS oxide having a thickness of between about 8000 and 15,000 Angstroms.

* * * * *